(12) United States Patent
Yamaura et al.

(10) Patent No.: US 7,534,957 B2
(45) Date of Patent: May 19, 2009

(54) CORD SWITCH AND DETECTING APPARATUS USING THE SAME

(75) Inventors: Akira Yamaura, Hitachi (JP); Yoshikazu Hayakawa, Hitachi (JP); Tatsuya Ohtaka, Hitachi (JP); Takashi Aoyama, Hitachi (JP); Tomiya Abe, Hitachi (JP); Masaaki Shimizu, Toyohashi (JP); Manabu Kato, Hamamatsu (JP)

(73) Assignees: Hitachi Cable, Ltd., Tokyo (JP); ASMO Co., Ltd., Kosai (JP)

( * ) Notice: Subject to any disclaimer, the term of this patent is extended or adjusted under 35 U.S.C. 154(b) by 249 days.

(21) Appl. No.: 11/590,002

(22) Filed: Oct. 31, 2006

(65) Prior Publication Data

US 2007/0117445 A1  May 24, 2007

(30) Foreign Application Priority Data

Oct. 31, 2005  (JP) .............................. 2005-317499

(51) Int. Cl.
*H01B 7/00* (2006.01)
(52) U.S. Cl. ....................................................... 174/36
(58) Field of Classification Search ................... 174/36, 174/110 R, 113, 115
See application file for complete search history.

(56) References Cited

U.S. PATENT DOCUMENTS

| | | | | |
|---|---|---|---|---|
| 2,843,694 A | * | 7/1958 | Bertaux | 200/86 R |
| 3,383,487 A | * | 5/1968 | Wiener | 200/302.1 |
| 4,876,420 A | * | 10/1989 | Lodini | 200/86 R |
| 6,078,014 A | * | 6/2000 | Kashiwazaki et al. | 200/61.43 |
| 6,107,580 A | * | 8/2000 | Hoshikawa et al. | 200/61.43 |
| 6,166,338 A | * | 12/2000 | Ebato | 200/61.43 |
| 6,316,846 B1 | | 11/2001 | Kashiwazaki et al. | |
| 6,747,227 B2 | * | 6/2004 | Marmaropoulos et al. | 200/550 |
| 7,256,347 B2 | * | 8/2007 | Gustavsson | 174/74 R |
| 2001/0017587 A1 | * | 8/2001 | Suzuki et al. | 340/545.7 |
| 2004/0037051 A1 | * | 2/2004 | Hagiwara et al. | 361/749 |

FOREIGN PATENT DOCUMENTS

| | | | |
|---|---|---|---|
| JP | 2-26414 A | | 1/1990 |
| JP | 11-191338 | * | 7/1999 |
| JP | 11-238426 | * | 8/1999 |
| JP | 2004-185812 | * | 7/2004 |
| JP | 2004-257788 A | | 9/2004 |
| JP | 3623572 B2 | | 12/2004 |
| WO | WO 97/21235 A1 | | 6/1997 |

* cited by examiner

Primary Examiner—William H Mayo, III
(74) Attorney, Agent, or Firm—Foley & Lardner LLP

(57) ABSTRACT

A cord switch 1 has wire electrodes 12A, 12B spirally arranged along an inner surface of a hollow part 10 of a hollowed insulator 11 in a longitudinal direction such that the wire electrodes do not electrically contact with each other, an outer electrode 13 provided around an outer periphery surface of the hollowed insulator 11 and jacketed with an insulating layer 14. An electrostatic capacitance is formed between the outer electrode 13 and a wire electrode for grounding, and a floating electrostatic capacitance is formed between the outer electrode 13 and the earth. The close approach of the human body to the cord switch 1 can be detected in a non-contact manner by measuring the alteration in the electrostatic capacitance.

17 Claims, 10 Drawing Sheets

CORD SWITCH AND DETECTING APPARATUS USING THE SAME

The present application is based on Japanese patent application No. 2005-317499 filed on Oct. 31, 2005, the entire contents of which are incorporated herein by reference.

BACKGROUND OF THE INVENTION

1. Field of the Invention

The invention relates to a cord switch and a detecting apparatus using the same, and more particularly, to a cord switch for detecting that an article or a human body is caught (stuck) or almost caught (stuck) in an automatic door or the like and a detecting apparatus using the same.

2. Description of the Related Art

For example, in several types of vehicles, a sensor is installed at a tip end of a door using an automatic switching mechanism such as a power sliding door, back door, or the like, so as to detect a condition of the article or the human body when the article or the human body is caught or nearly caught between mechanical parts such as the door and the car body, and to reversely move the door in an opening direction when the abnormality is detected.

A cord switch has been proposed as a sensor for realizing the above object.

So-called "cord switch" is a pressure sensitive cable switch for sensing the pressure alteration to switch the ON/OFF-state of the automatic switching mechanism. The "cord switch" is typically a contact type cable switch (contact cable). They maybe also called as a cord-like switch or a cable-type pressure sensor.

A contact type cord switch, in which a plurality of wire electrodes come in contact with each other to conduct an ON/OFF operation in response to alteration in a pressure when the article contacts a power window or an automatic door, has been known. For example, such a contact type cord switch is disclosed by a domestic re-publication of PCT international patent publication No. WO97/21235.

FIG. 9 shows a structure of a conventional cord switch disclosed by the domestic re-publication of PCT international patent publication No. WO97/21235. A cord switch 100 comprises a hollowed insulator 101 having a restorability (restorative characteristic), and four wire electrodes 102A, 102B, 102C, 102D spaced apart from one another at a predetermined interval and spirally arranged along an inner surface of the hollowed insulator 101 in a longitudinal direction.

The hollowed insulator 101 holds the wire electrodes 102 to 102D, in other words, the wire electrodes 102A to 102D are embedded at the inner surface of the hollowed insulator 101 such that the wired electrodes 102A to 102D do not electrically contact with each other. The hollowed insulator 101 comprises a material, which is easily deformed by an external force and restored as soon as the external force is removed, for example, a restorative rubber or a restorative plastic.

The wire electrodes 102A to 102D comprise a metal wire comprising a single wire or a plurality of stranded wires, and a conductive rubber layer or a conductive plastic layer coated on an outer periphery of the metal wire.

FIG. 10 shows a detecting apparatus using the cord switch 100 shown in FIG. 9. In a detecting apparatus 200, a power source 107 and an ammeter 108 are connected in series between a beginning end 104A of the wire electrode 102A and a beginning end 104D of the wire electrode 102D, and a resistor 106 is connected between a beginning end 104B of the wire electrode 102B and a beginning end 104C of the wire electrode 102C. Furthermore, a short circuit line 109A is connected between a terminal end 105L of the wire electrode 102A and a terminal end 105B of the wire electrode 102B, and a short circuit line 109B is connected between a terminal end 105C of the wire electrode 102C and a terminal end 105D of the wire electrode 102D.

In the detecting apparatus 200 shown in FIG. 10, a feeble monitor current i is usually supplied from the power source 107. Therefore, when the external force is applied to the cord switch 100 from the outside, either one of the wire electrodes 102A and 102B contacts with either one of the wire electrode 102C and 102D, as a result a short-circuit current bypassing the resistor 106 is flown, so that the abnormality is detected by sensing an increase of a measured value of the ammeter 106 caused by this current change.

In addition, as another kind of sensor which does not depend on the alternation in pressure, an electrostatic capacitance type sensor is proposed. For example, a non-contact type sensor which detects a risk that the article may be caught in the automatic door, window or the like before contacting the automatic door or window by utilizing an alteration in a floating capacitance or a resistance loss between the article and the electrode has been known. For example, such a non-contact type sensor is disclosed by Japanese Patent Laid-Open No. 2-26414.

However, according to the conventional cord switches, there is a disadvantage in that a detection signal is not output until the hollowed insulator 101 is so deformed that either one of the wire electrodes 102A, 102B contacts with either one of the wire electrodes 102C, 102D, as a result, a considerable force is already applied to the article or the human body when the abnormality is detected. In addition, there is a further disadvantage in that the force applied to the article or the human body caught in the door may be increased, if a closing speed of the door is increased so as to improve the convenience.

Furthermore, the non-contact type sensor disclosed by Japanese Patent Laid-Open No. 2-26414 is inferior to the contact type sensor in regard to a reliability of the detection capacity, since the detection capacity may be varied in accordance with the characteristics, condition, size or the like of the article. In addition, if a detecting range is broadened, the malfunction will easily occur. To the contrary, if the detecting range is narrowed so as to avoid the malfunction, it may be impossible to detect a small article.

SUMMARY OF THE INVENTION

Accordingly, it is an object of the invention to provide a cord switch and a detecting apparatus using the same, in that a non-contact type detecting function for detecting the contact before contacting with the article, while keeping a contact type detecting function that is superior to the non-contact type detecting function in the reliability.

According to a first aspect of the invention, a cord switch comprises:

a hollowed insulator having restorability, a plurality of wire electrodes arranged along an inner surface of a hollow part of the hollowed insulator in a longitudinal direction such that the wire electrodes do not electrically contact with each other; and an outer electrode provided around an outer periphery surface of the hollowed insulator such that an electrostatic capacitance is formed between the outer conductor and the wire electrode and a floating electrostatic capacitance can be formed between the outer conductor and the earth.

According to the cord switch in the first aspect of the invention, in addition to the contact type detection using the contact between the wire electrodes, a fixed electrostatic capacitance is formed between an outer electrode and a wire electrode for ground among a plurality of the wire electrodes, as well as a floating electrostatic capacitance is formed by the human body between the outer electrode and the earth, so that the access of the article to the cord switch can be detected surely and quickly in non-contact manner based on presence of formation of the floating electrostatic capacitance.

In the cord switch, the outer electrode may comprise fine conductive wires wound around the outer periphery surface of the hollowed insulator. Further, the outer electrode may comprise fine conductive wires braided to cover the outer periphery surface of the hollowed insulator.

In the cord switch, the outer electrode may comprise a strip-shaped conductive member wound around the outer periphery surface of he hollowed insulator. Further, the outer electrode may comprise a conductive member provided around the outer periphery surface of the hollowed insulator along the longitudinal direction to have a strip-shape.

When the cord switch is bent, the outside of the hollowed insulator is expanded while the inside of the hollowed insulator is compressed. However, according to a structure where the fine conductive wires are wound around an outer periphery surface of the hollowed insulator, the fine conductive wires wound around the hollowed insulator follow the bending to be easily deformed, so that the bending property of the cord switch can be improved.

In the cord switch, it is preferable that the outer electrode is jacketed with an insulating layer.

A detection sensitivity of the floating capacitance can be adjusted by the insulating layer.

In the cord switch, each of the wire electrodes comprises a metal strand wire coated with a conductive electrode member.

According to this structure, the bending performance can be improved.

In the cord switch, the hollowed insulator may comprise a restorative rubber and the conductive electrode member comprises a conductive rubber. Further, the hollowed insulator may comprise a restorative resin and the conductive electrode member comprises a conductive plastic.

A high bonding strength can be obtained by making the hollowed insulator and the electrode member of the similar materials.

According a second aspect of the invention, a detecting apparatus comprises:

a cord switch comprising:

a hollowed insulator having restorability, a plurality of wire electrodes including a first wire electrode for signal and a second wire electrode for grounding, the wire electrodes being arranged along an inner surface of a hollow part of the hollowed insulator in a longitudinal direction such that the wire electrodes do not electrically contact with each other; and an outer electrode provided around an outer periphery surface of the hollowed insulator such that an electrostatic capacitance is formed between the outer conductor and the second wire electrode for grounding and a floating electrostatic capacitance can be formed between the outer conductor and the earth;

a first detecting unit for detecting an alteration in an electric potential or an alteration in a current flow between the first wire electrode for signal and the second wire electrode for grounding; and a second detecting unit, connected to the outer electrode, for detecting an alteration in the electrostatic capacitance and an alteration in the floating electrostatic capacitance by measuring the electrostatic capacitance and the floating electrostatic capacitance.

In the detecting apparatus, the number of the wire electrodes may be 2n (n is a positive integer). Further, the cord switch may comprise four wire electrodes, and each two of the wire electrodes are connected in series. Still further, the cord switch may comprise four wire electrodes, and each two of the wire electrodes are connected in parallel.

Still further, the detecting apparatus may further comprise:

a third wire electrode connected in series between the first wire electrode for signal and the second wire electrode for grounding; and a resistor connected between the first wire electrode for signal and the second wire electrode for grounding via the third wire electrode.

According to the detecting apparatus in the first and second preferred embodiments of the invention, a contact type switch is composed of a combination of the wire electrodes of the cord switch and a first detecting unit, and a non-contact type switch is composed of a combination of an outer electrode, a wire electrode for ground and a second detecting unit, so that an access of the object to the cord switch can be surely and quickly detected by two kinds of detection methods.

According to the present invention, it is possible to provide a cord switch and a detecting apparatus having both a non-contact type detecting function for detection before contacting the article and the contact type detecting function which is superior to the non-contact type detecting function in the reliability.

BRIEF DESCRIPTION OF THE DRAWINGS

The preferred embodiment of the invention will be described in conjunction with the appended drawings:

FIGS. 4A and 4B are diagrams showing a cord switch in the second preferred embodiment according to the invention, wherein FIG. 4A is a cross-sectional view of the cord switch at a normal state and FIG. 4B is a cross sectional view of the cord switch when deformed due to the external force;

FIGS. 7A and 7B are diagrams showing a cord switch in the fourth preferred embodiment, wherein FIG. 7A is a front view of an essential part and FIG. 7B is a front view of the essential part when bending;

PREFERRED EMBODIMENTS OF THE INVENTION

Next, the preferred embodiments of the invention will be described in more detail in conjunction with the appended drawings.

First Preferred Embodiment (Structure of a Cord Switch)

Figure 1:
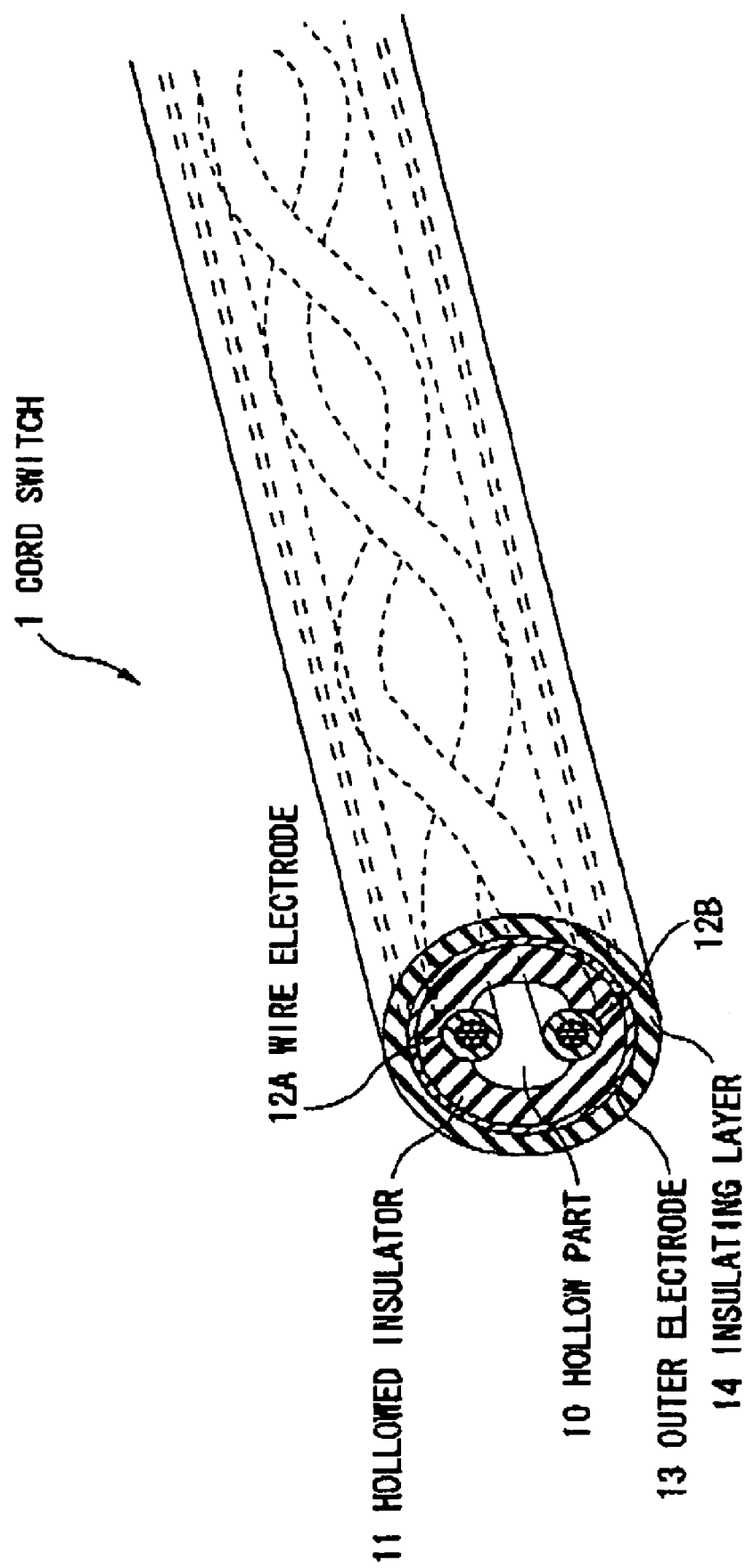
FIG. 1 is a perspective view of a cord switch in the first preferred embodiment according to the invention.
Figure 2:
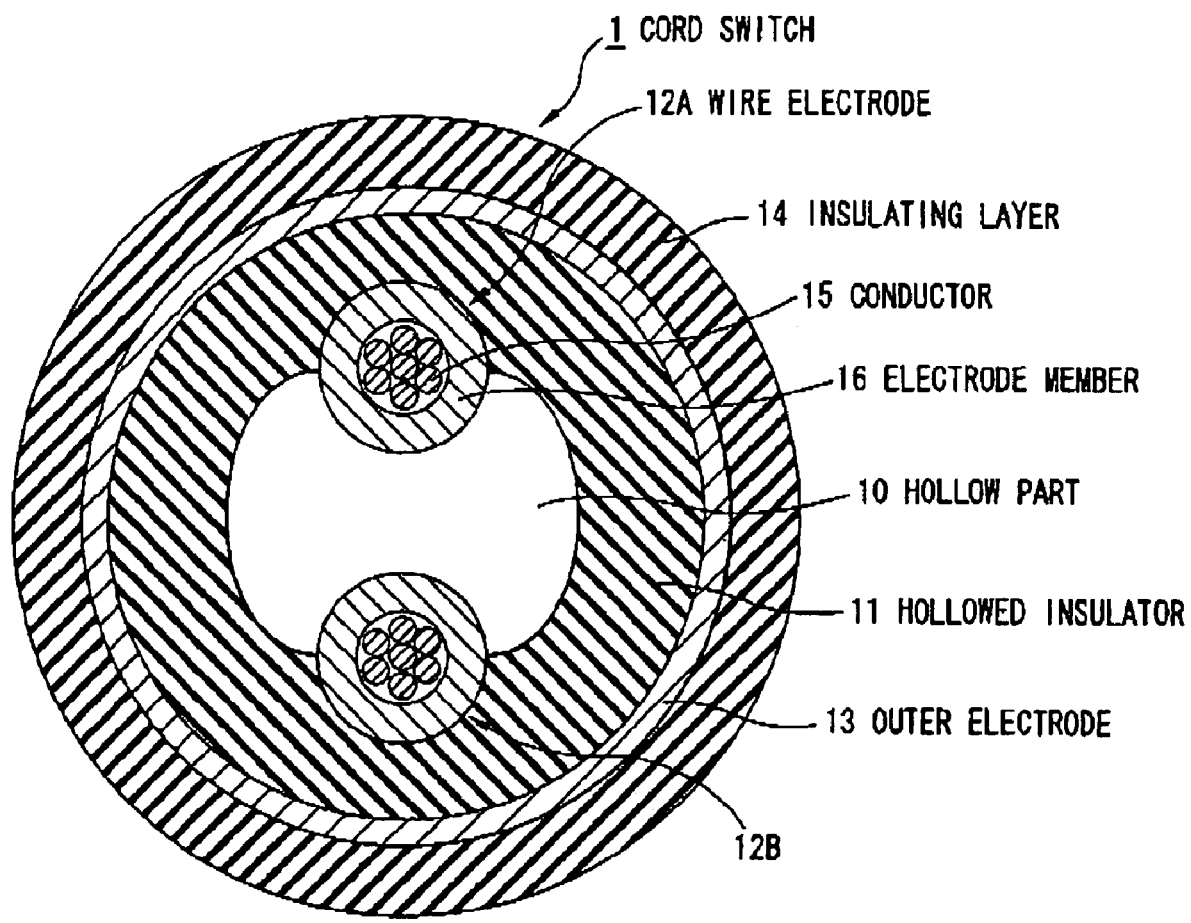
FIG. 2 is a cross-sectional view of the cord switch shown in FIG. 1.

FIG. 1 is a perspective view showing a cord switch in the first preferred embodiment according to the invention, and FIG. 2 is a cross-sectional view of the cord switch of FIG. 1.

As shown in FIGS. 1 and 2, a cord switch 1 comprises a hollowed insulator 11 composed of a restorative material with a substantially circular cross section and including a hollow part 10 at a center part, and a pair of wire electrodes 12A, 12B spaced apart from one another at a predetermined interval and spirally arranged along an inner surface of the hollowed insulator 11 in a longitudinal direction, an outer electrode 13 arranged around an outer periphery surface of the hollowed insulator 11, and an insulating layer 14 to jacket the outer electrode 13.

The hollowed insulator 11 has the pair of the wire electrodes 12A, 12B held and fixed spirally at the inner surface thereof and the wire electrodes 12A, 12B are not in contact with each other electrically, and the wire electrodes 12A, 12b are partially embedded in the hollowed insulator 11. The hollowed insulator 11 is composed of a material that can be easily deformed when contacting the article such that the wire electrode 12A and the wire electrode 12B electrically contact with each other, and restored as soon as the external force is removed. The material for forming the hollowed insulator 11 may include restorative rubber, restorative plastic, elastomer or the like.

The restorative rubber includes silicone rubber, ethylene propylene rubber, styrene-butadiene rubber, chloroprene rubber or the like. The restorative plastic includes polyethylene, ethylene-vinyl acetate copolymer, ethylene-ethyl acrylate copolymer, ethylene-methyl methacrylate copolymer, polypropylene, polyvinylchloride or the like. In addition, the elastomer includes olefin system or styrene system thermoplastic elastomer.

As shown in FIG. 2, each of the wire electrodes 12A, 12B comprises a conductor 15 composed of a metal stranded wire made by stranding a plurality of annealed copper wires (the number of wires is seven in FIG. 2) coated with Sn-plating, Ag-plating, or Ni-plating, and an electrode member 16 for coating an outer periphery of the conductor 15, which is composed of resin or rubber in which a resistance is lowered by blending carbon. Herein, each of the wire electrodes 12A, 12B may be a single wire of annealed copper or the like.

The outer conductor 13 is a conductor which forms an electrostatic capacitance between the wire electrodes 12A, 12B and the outer conductor 13. The outer electrode 13 may have following configurations.

(1) The configuration in which the outer periphery of the hollowed insulator 11 is covered with a braid of the fine metallic wires such as annealed copper wires coated with Sn-plating, Ag-plating or the like (braid configuration).

(2) The configuration in which the outer periphery of the hollowed insulator 11 is wound by the fine metallic wires such as annealed copper wires coated with Sn-plating, Ag-plating or the like (winding configuration).

(3) The configuration in which the outer periphery surface of the hollowed insulator 11 is wrapped by a metal foil composed of copper, aluminum or the like to provide a conductive member, or a conductive member is provided in the longitudinal direction of the hollowed insulator 11 to have a strip shape (lengthwise wrapping).

(4) The configuration in which the outer periphery of the hollowed insulator 11 is wound by or wrapped in the longitudinal direction by a resin tape or a resin fiber composed of PET (polyethylene terephthalate), PP (polypropylene) or the like, having a metal film on its one surface by evaporation, plating to provide a conductive member.

(5) The configuration in which the outer periphery of the hollowed insulator 11 is coated by a conductive member composed of a conductive resin or a conductive rubber.

(6) The configuration in which the outer periphery of the hollowed insulator 11 is wound by or wrapped in the longitudinal direction by a conductive member composed of a plate-like conductive resin or a plate-like conductive rubber.

In addition, a drain wire composed of a metal strand wire conductor or a thin metal plate may be provided between the outer electrode 13 and the insulating layer 14, so as to facilitate the grounding operation of the outer electrode 13. In addition, a resin tape for separation or a paper tape for separation may be provided either or both between the outer electrode 13 and the hollowed insulator 11, and the outer electrode 13 and the insulating layer 14.

The insulating layer 14 is provided for insulating and protecting the outer electrode 13. The outer electrode 13 may be coated by an insulating material such as urethane, PVC (polyvinyl chloride), rubbers such as EP (epoxy resin) rubber, silicone rubber, PET or the like. Alternatively, the outer electrode 13 may be wound with a strip-like (tape-like) insulating material. In addition, it is preferable that an outer diameter of the insulating layer 14 is around 3 to 5 mm, with considering installation characteristics, flexibility, and workability. Further, it is preferable that the insulating layer 14 has the restorability.

In addition, so as to adjust the detection sensitivity of the floating capacitance, following configurations may be adopted. For example, a low dielectric filler may be mixed with the insulating layer 14, or the insulating layer 14 may be composed of a foam material. A dielectric material may be provided between the outer electrode 13 and the insulating layer 14, or a high dielectric member may be disposed around an outer periphery of the insulating layer 14.

(Structure of Detecting Apparatus)

Figure 3:
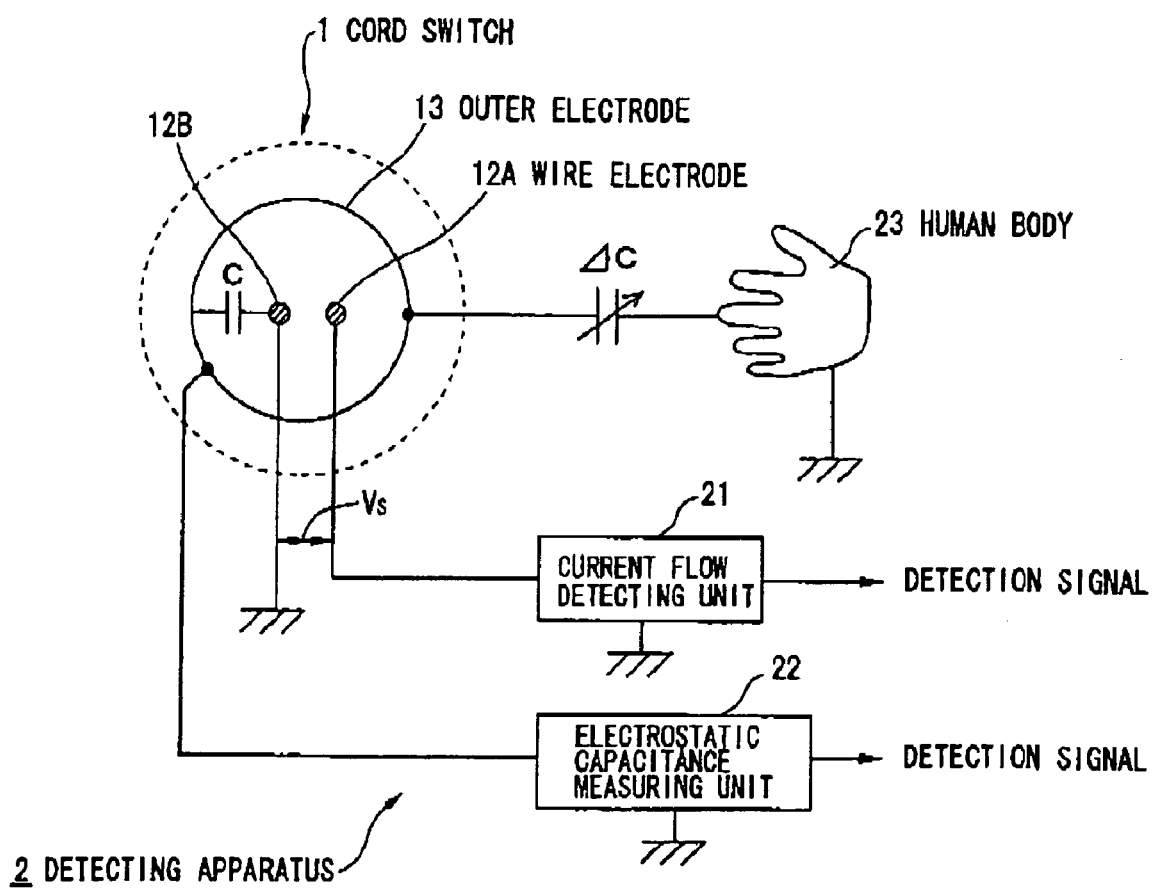
FIG. 3 is a schematic diagram showing a connection of a detecting apparatus using the cord switch of FIG. 1.

FIG. 3 shows a detecting apparatus using the cord switch shown in FIG. 1.

The detecting apparatus 2 comprises a cord switch 1 as described above, a current flow detecting unit 21 connected to a wire electrode 12A of the cord switch 1 as a first detecting unit, and an electrostatic capacitance measuring unit 22 connected to an outer electrode 13 as a second detecting unit. In addition, a wire electrode 12B is grounded.

The current flow detecting unit 21 comprises a power source circuit for applying a predetermined DC voltage Vs between the wire electrodes 12A, 12B, and a detection circuit for detecting that a potential between the wire electrodes 12A, 12B is varied from the DC voltage Vs to level 0.

The electrostatic capacitance measuring unit 22 measures an electrostatic capacitance C between the wire electrode 12B and the outer electrode 13, and an electrostatic capacitance (C+ΔC), which is a sum of a floating electrostatic capacitance ΔC generated when a human body 23 comes close to the cord switch 1 and the electrostatic capacitance C. The electrostatic capacitance measuring unit 22 is construed to generate a detection signal when an increase in the floating electrostatic capacitance ΔC is detected.

(Operation of the Cord Switch and the Detecting Apparatus)

Herein, it is assumed that the cord switch 1 is installed on a power sliding door of a vehicle. In addition, the operation of other kinds of doors such as a back door, a window, is also similar to that of the power sliding door.

(Detecting Operation by the Current Flow Detecting Unit)

Firstly, an operation of the current flow detecting unit 21 will be explained below.

When the human body 23 comes in contact with the cord switch 1 during a closing operation of the sliding door, an external force is applied to a contact point of the cord switch 1, so that the contact point is deformed. When the external force is large, the hollowed insulator 11 becomes flat, and a surface of the wire electrode 12A comes in contact with a surface of the wire electrode 12B in the hollow part 10.

The DC voltage Vs applied between the wire electrodes 12A and 12B becomes 0V due to the contact between the wire electrodes 12A and 12B. In accordance with this alteration in the electric potential, the current flow detecting unit 21 generates a detection signal. Based on this detection signal, a door driving circuit (not shown) rotates a motor for driving a door (door driving motor) in a reverse direction to drive the sliding door in an opening direction. According to this operation, an overpressure is not applied on the human body 23. In addition, the detecting operation is conducted similarly for an article other than the human body 23 such as a luggage. In addition, when the external force is no longer applied, the hollowed insulator 11 is restored to an original shape, and the insulating layer 14 is also restored to an original shape by virtue of a restoring force of the hollowed insulator 11 and a restoring force of itself.

(Detecting Operation of the Electrostatic Capacitance Measuring Unit)

Next, a detecting operation of the electrostatic capacitance measuring unit 22 will be explained.

Between the outer electrode 13 and the wire electrode 12B, the electrostatic capacitance C is always formed. The electrostatic capacitance C does not vary in a normal condition wherever the sliding door is located.

Next, when the cord switch 1 comes close to the human body 23 during the closing operation of the sliding door, the floating electrostatic capacitance C is formed by the human body 23 between the outer electrode 13 and the earth, regardless of presence of the external force applied to the cord switch 1. The sum (C+ΔC) of this floating electrostatic capacitance ΔC and the electrostatic capacitance C is measured by the electrostatic capacitance measuring unit 22.

The electrostatic capacitance measuring unit 22 supplies a detection signal based on that the electrostatic capacitance is varied from C to (C+ΔC). Based on this detection signal, the door driving circuit (not shown) rotates the door driving motor in the reverse direction to drive the sliding door in the opening direction.

Effect of the First Preferred Embodiment

According to the first preferred embodiment, the following effects can be obtained.

(a) The electrostatic capacitance is measured by the electrostatic capacitance measuring unit 22, and the presence of the human body 23 or the article can be detected surely and quickly in the non-contact manner based on the alteration in the measured electrostatic capacitance.

(b) Since a function of the conventional contact type cord switch is realized by comprising the wire electrodes 12A and 12B, it is possible to detect a pressure of being caught in the door or the like with a high reliability.

(c) Since the electrostatic capacitance C is varied in accordance with the change in the length of the wire electrode 12B, it is possible to detect disconnection of the wire electrode 12B based on the alteration in the electrostatic capacitance C. In addition, if the connection to the electrostatic capacitance measuring unit 22 of the wire electrode 12A and the wire electrode 12B is replaced with each other, it is possible to detect disconnection of the wire electrode 12A.

The Second Preferred Embodiment

Figure 4A:
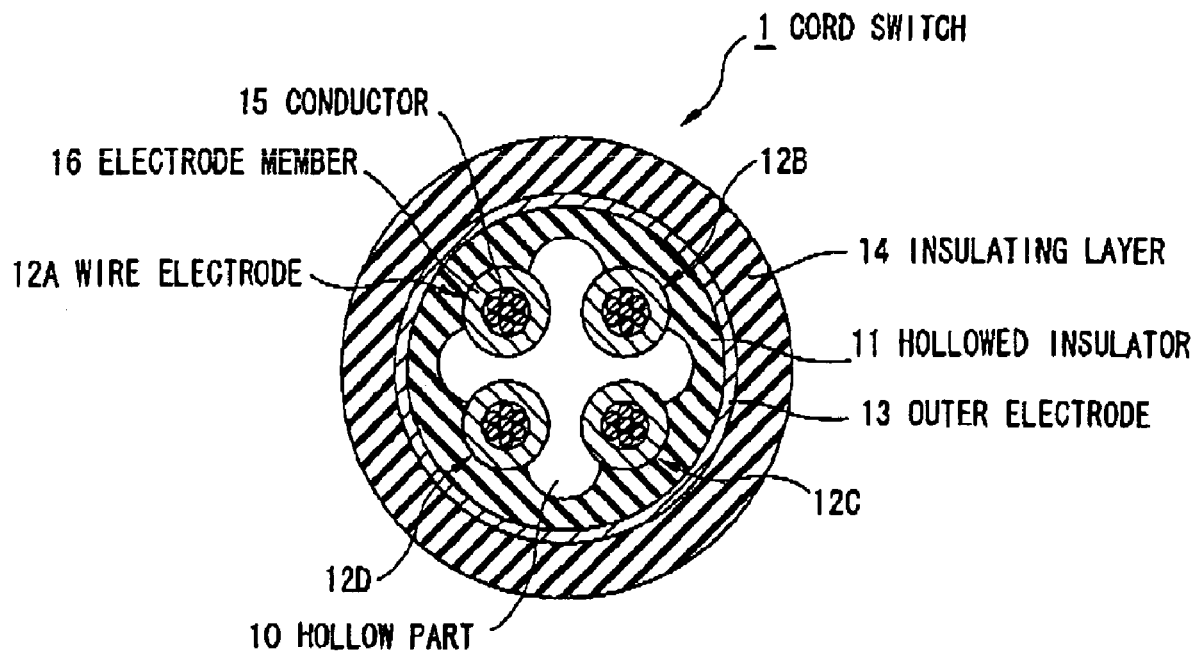
Figure 4B:
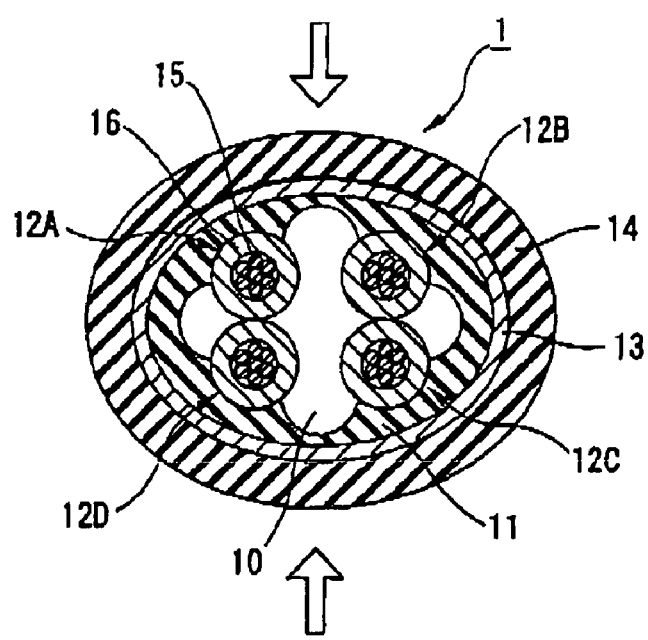

FIGS. 4A and 4B are diagrams showing a cord switch in the second preferred embodiment according to the invention, wherein FIG. 4A is a cross-sectional view of the cord switch at a normal state and FIG. 4B is a cross sectional view of the cord switch when deformed due to the external force.

In this preferred embodiment, the number of the wire electrodes is four in place of two in the first preferred embodiment, and other structure is similar to the first preferred embodiment.

The hollow part 10 of the hollowed insulator 11 has a cross-like shape in its cross section, namely, the hollowed insulator 11 are provided with four concave portions and four convex portions. Wire electrodes 12A, 12B, 12C, 12D are arranged between the concave portions of the hollowed insulator 11, and partially embedded at the convex portions of the hollowed insulator 11. The wire electrodes 12A to 12D are held spirally in an inner surface of the hollowed insulator 11 such that the wire electrodes 12A to 12D are not dropped out.

Figure 5:
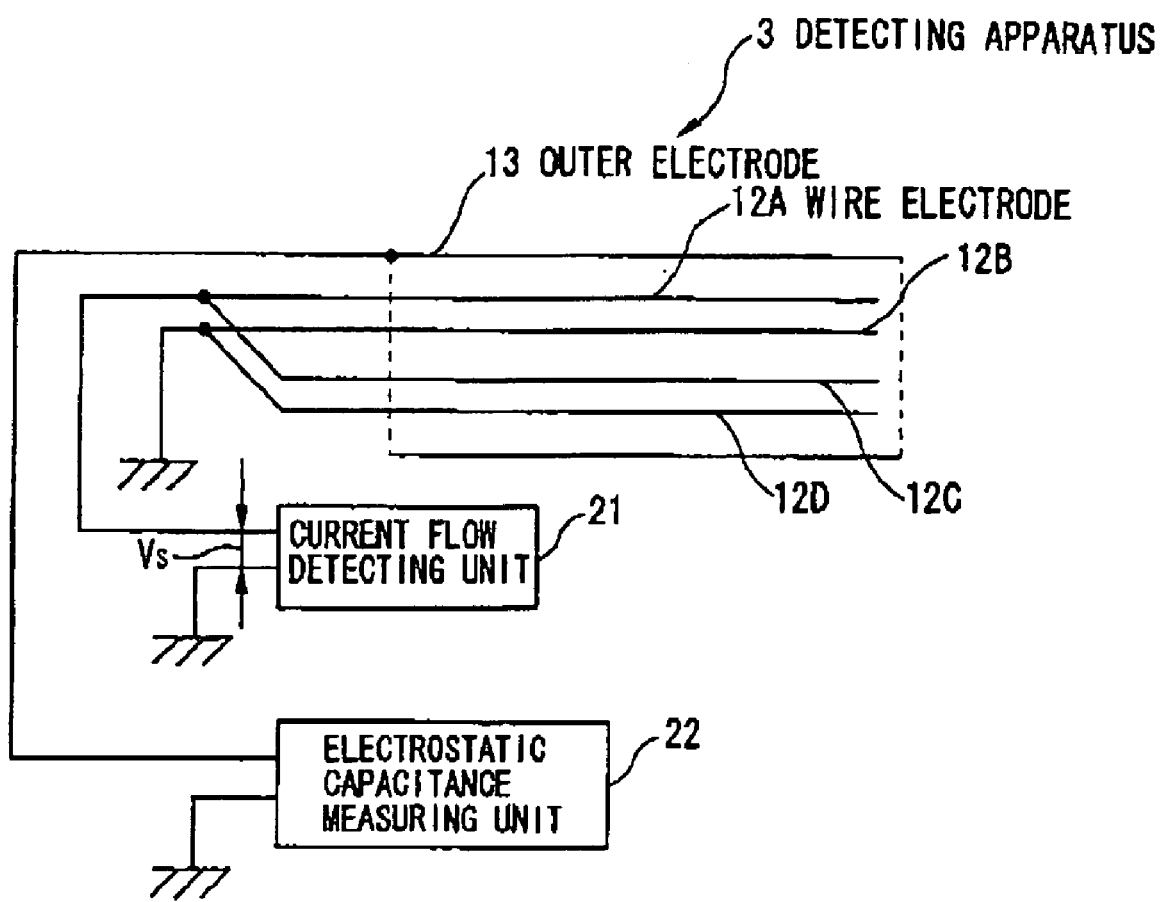
FIG. 5 is a schematic diagram showing a connection of a detecting apparatus using the cord switch of FIGS. 4A and 4B.

FIG. 5 is a schematic diagram showing a connection of a detecting apparatus using the cord switch of FIGS. 4A and 4B. This detecting apparatus 3 comprises the wire electrode 12A to 12D connected in parallel. In other words, the detecting apparatus 3 is construed such that each terminal end of the wire electrodes 12A to 12D is opened, the current flow detecting unit 21 is connected to each of beginning ends of the wire electrodes 12A, 12C, each of beginning ends of the wire electrodes 12B, 12D are grounded, and the electrostatic capacitance measuring unit 22 is connected to the outer electrode 13.

Next, operation of the detecting apparatus 3 will be explained.

When the human body 23 or the like comes in contact with the cord switch 1 during a closing operation of the sliding door, an external force is applied to a contact point of the cord switch 1, so that the contact point is deformed. When the external force is great, the hollowed insulator 11 becomes flat as shown in FIG. 4B, and the wire electrodes 12A, 12B come in contact with wire electrode 12D, 12C. In addition, when the external force is applied from a lateral direction in FIG. 4B, the wire electrodes 12B, 12C come in contact with the wire electrodes 12A, 12D.

The DC voltage Vs at an input end of the current flow detecting unit 21 becomes 0V due to the contact between the wire electrodes as described above. In accordance with this alteration in the electric potential, the current flow detecting unit 21 generates the detection signal. Based on this detection signal, a door driving circuit (not shown) rotates a door driving motor in a reverse direction to drive the sliding door in an opening direction. According to this operation, it is possible to prevent an overpressure from being applied on the human body 23 or the like. In addition, since the detecting operation of the electrostatic capacitance measuring unit 22 is already explained in the first preferred embodiment, the explanation therefore is omitted here.

Effect of the Second Preferred Embodiment

According to the second preferred embodiment, the following effects can be obtained.

(a) Since four wire electrodes 12A to 12D are used, it is possible to detect the pressure applied from omni-directions (e.g. lateral and vertical directions) of the cord switch 1 as shown in FIGS. 4A and 4B.

(b) Since two wire electrodes are assigned for signal and other two wire electrodes are assigned for grounding, the short circuit is formed surely, so that the reliability in the detection can be enhanced.

(c) Since all the connections of the wire electrodes 12A to 12D can be done at the beginning ends in the detecting apparatus 3, the assembling of the circuit can be facilitated.

Other effects are similar to those in the first preferred embodiment.

The Third Preferred Embodiment

Figure 6:
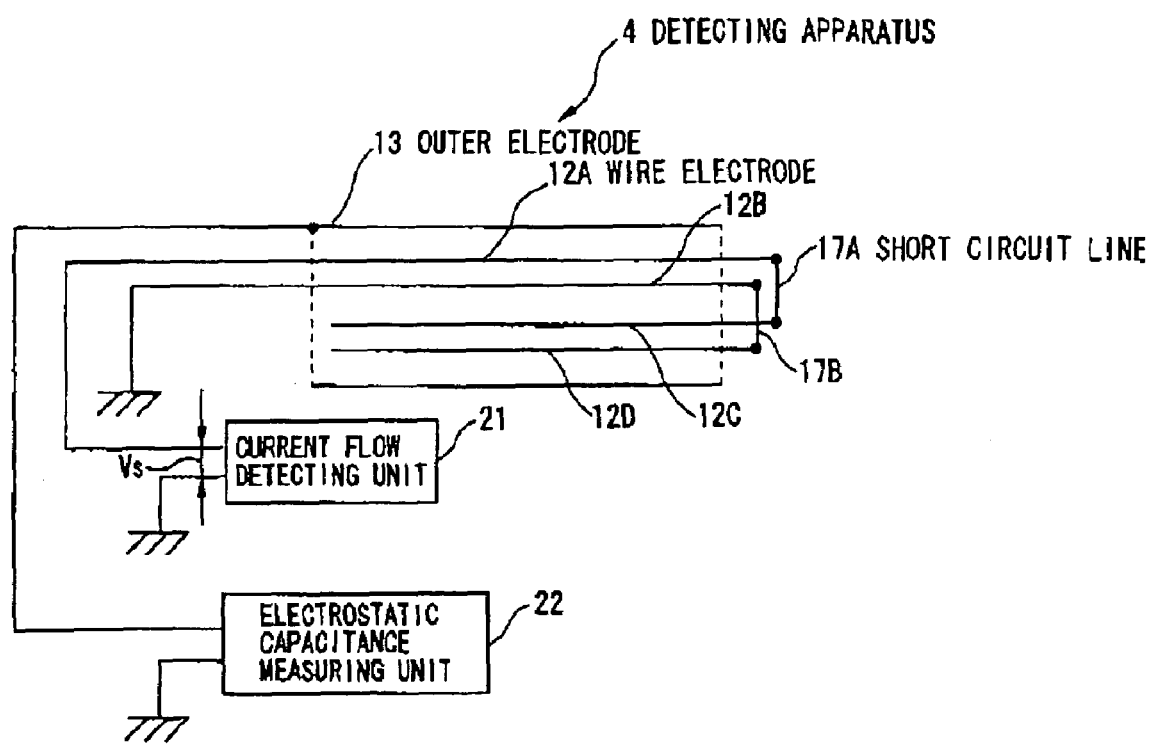
FIG. 6 is a schematic diagram showing a connection of a detecting apparatus in the third preferred embodiment.

FIG. 6 is a schematic diagram showing a connection of a detecting apparatus in the third preferred embodiment using the cord switch of FIGS. 4A and 42. This detecting apparatus 4 comprises the wire electrode 12A to 12D connected in series. In other words, the detecting apparatus 4 is construed such that each terminal end of the wire electrodes 12A, 12C are connected by a short circuit line 17A, each terminal end of the wire electrodes 12C, 12D are connected by a short circuit line 17B, the current flow detecting unit 21 is connected to a beginning end of the wire electrodes 12A, a beginning end of the wire electrodes 12B is grounded, beginning ends of the wire electrodes 12C, 12D are opened, and the electrostatic capacitance measuring unit 22 is connected to the outer electrode 13.

Next, operation of the detecting apparatus 4 will be explained.

When the human body 23 or the like comes in contact with the cord switch 1 during a closing operation of the sliding door, an external force is applied to a contact point of the cord switch 1, so that the contact point is deformed. When the external force is large, the hollowed insulator 11 becomes flat as shown in FIG. 4B, and the wire electrode 12A comes in contact with the wire electrode 12D as well as the wire electrode 12B comes in contact with the wire electrode 12C. As a result, the electric potential between the beginning ends of the wire electrodes 12A, 12B varies from the DC voltage to 0V.

In accordance with this alteration in the electric potential, the current flow detecting unit 21 generates the detection signal. Based on this detection signal, a door driving circuit (not shown) rotates a door driving motor in a reverse direction to drive the sliding door in an opening direction. According to this operation, it is possible to prevent an overpressure from being applied on the human body 23 or the like. In addition, since the detecting operation of the electrostatic capacitance measuring unit 22 is already explained in the first preferred embodiment, the explanation therefor is omitted here.

Effect of the Third Preferred Embodiment

According to the third preferred embodiment, the following effects can be obtained.

(a) Since four wire electrodes 12A to 12D are used, it is possible to detect the pressure applied from omni-directions of the cord switch 1 shown in FIGS. 4A and 4B.

(b) Since two wire electrodes are assigned for the signal and the grounding respectively, the short circuit is formed surely, so that a reliability in the detection can be enhanced.

(c) Since all the wire connections of the wire electrodes 12A to 12D can be assigned to the beginning ends and the terminal ends in the detecting apparatus 3, the connection at the beginning ends can be simplified.

Other effects are similar to those in the first preferred embodiment.

The Fourth Preferred Embodiment

Figure 7A:
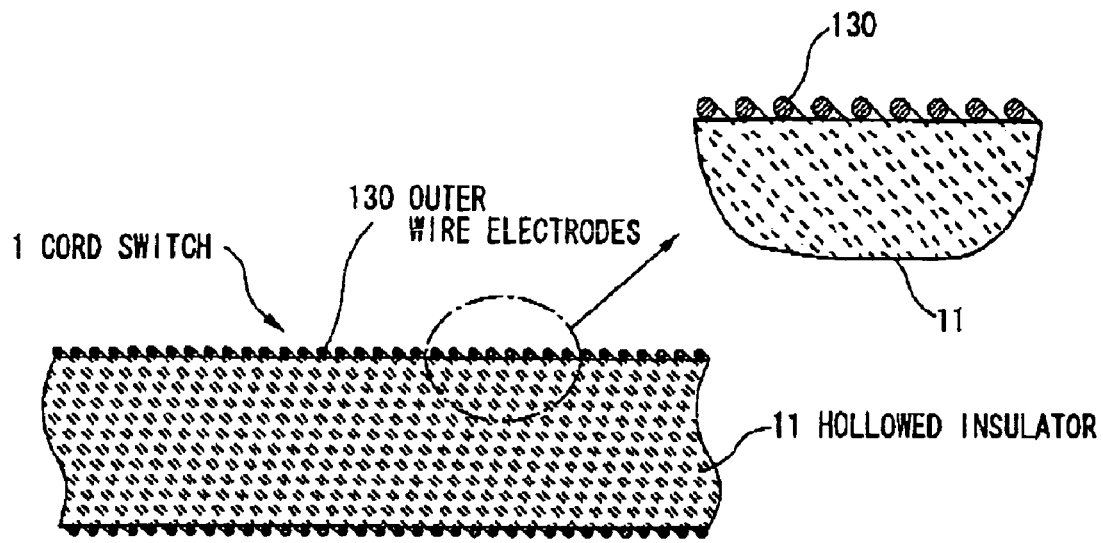
Figure 7B:
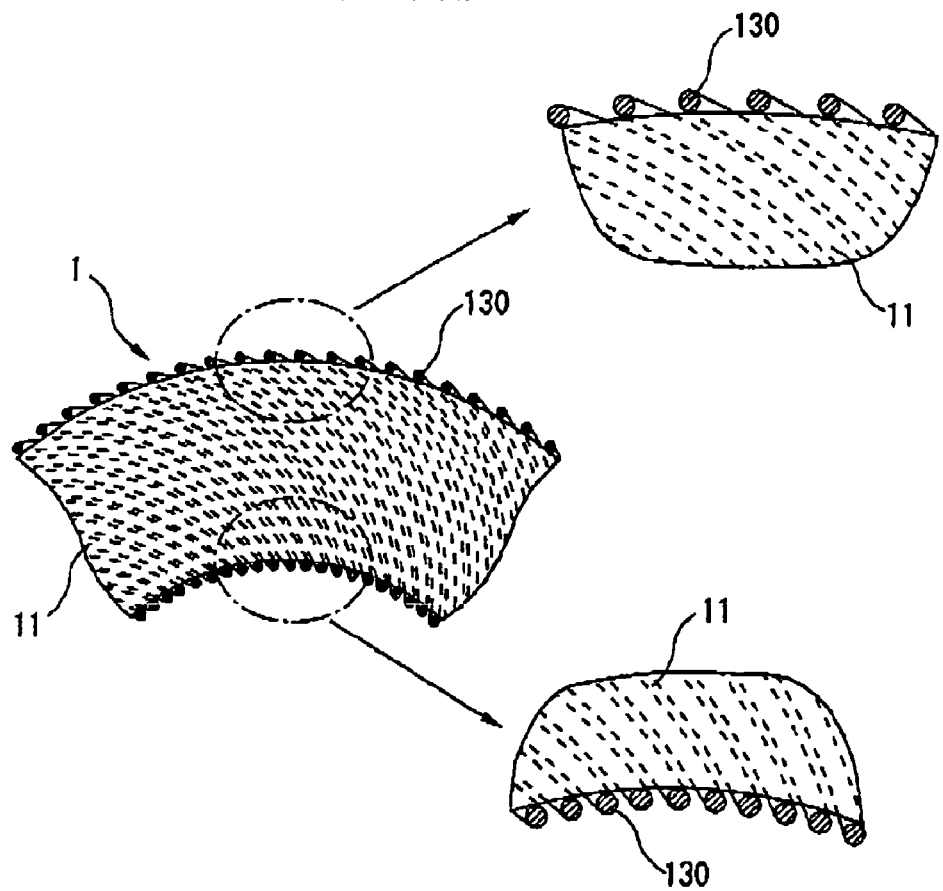

FIGS. 7A and 7B are diagrams showing a cord switch in the fourth preferred embodiment, wherein FIG. 7A is a front view of an essential part and FIG. 7B is a front view of the essential part when bending.

In addition, outer wire electrodes 130 described below are shown in enlarged cross-sections in FIGS. 7A and 7B.

In the fourth preferred embodiment, the outer wire electrodes 130 are spirally wound around an outer periphery of the hollowed insulator 11 as the outer electrode 13 in the first preferred embodiment. In FIGS. 7A and 7B, the insulating layer 14 which is the outermost layer is not shown.

As the outer wire electrodes 130, metal such as copper, copper alloy can be used.

According to the fourth preferred embodiment, when the cord switch 1 is bent, the outside of the hollowed insulator 11 is extended while the inside of the hollowed insulator 11 is compressed as shown in FIG. 7B, and the outer wire electrodes 130 easily deforms in accordance with the deformation of the hollowed insulator 11, so that the flexibility of the cord switch can be improved.

Next, examples of the present invention will be explained.

EXAMPLE 1

Herein, according to the structure shown in FIGS. 4A and 4B, Examples 1 to 3 are fabricated as follows.

In the Example 1, a tin-plated annealed copper stranded wire (made by stranding seven wires each having a diameter of 0.127 mm) is coated with a conductive rubber to provide wire electrodes 12A to 12D having a diameter of 0.6 mm, and the wire electrodes 12A to 12D are spirally arranged along an inner surface of a hollowed insulator 11 having an outer diameter of 3.5 mm.

One hundred of the tin-plated annealed copper strand wires each having a diameter of 0.05 mm are wound around an outer periphery surface of the hollowed insulator 11 with a constant pitch to provide an outer electrode 13, and an outer periphery surface of the outer electrode 13 is jacketed with an insulating layer 14 composed of urethane having a thickness of 0.3 mm.

EXAMPLE 2

In the Example 2, after fabricating the wire electrodes 12A to 12D and the hollowed insulator 11 similarly to the Example 1, an aluminum/polyethylene terephthalate (Al/PET) tape with a width of 6 mm composed of a PET having a thickness of 4 μm adhered to an aluminum foil having a width of 7 μm is wound around an outer periphery surface of the hollowed insulator 11 with a constant pitch to provide an outer electrode 13, and an outer periphery surface of the outer electrode 13 is jacketed with an insulating layer 14 composed of urethane having a thickness of 0.4 mm.

The electrostatic capacitance and the alteration in the electrostatic capacitance of the Example 1 and the Example 2 were measured. As a result, the electrostatic capacitance of the Example 1 was 144 pF/m, and that of the Example 2 was 138 pF/m. When a metal plate having a width of 50 mm was distant by 30 mm from the cord switch 1, the alteration in the electrostatic capacitance for the Example 1 is 0.12 pF/m, and that of the Example 2 is 0.11 pF/m. As a result, the electrostatic capacitance and electrostatic capacitance alteration were substantially equal to each other in the Examples 1 and 2.

EXAMPLE 3

In the Example 3, after fabricating the wire electrodes 12A to 12D and the hollowed insulator 11 similarly to the Example 1, tin-plated annealed copper wires each having a diameter of 0.1 mm are braided around an outer periphery surface of the hollowed insulator 11 to provide an outer electrode 13 with a braided structure, and an insulating layer 14 composed of PVC (polyvinyl chloride) was jacketed with a thickness of 0.25 mm around an outer periphery surface of the outer electrode 13.

The cord switch 1 according to the Examples 1 to 3 thus fabricated is installed on a door of a vehicle to constitute the detecting apparatus 3 shown in FIG. 5, and the operating results are monitored. The results were excellent as both of the contact type switch and the non-contact type switch.

Other Preferred Embodiments

The present invention is not limited to the first to fourth preferred embodiments, and any variation is possible unless going beyond a scope of the invention. For example, the components in the first to fourth preferred embodiments can be combined arbitrarily. In addition, the configurations in which the number of the wire electrodes is 2 or 4 are described, however the number of the wire electrodes may be 4 or more. For this case, it is preferable that the number of the wire electrodes is the even number, i.e. the wire electrodes are provided as one or more pairs.

Figure 8:
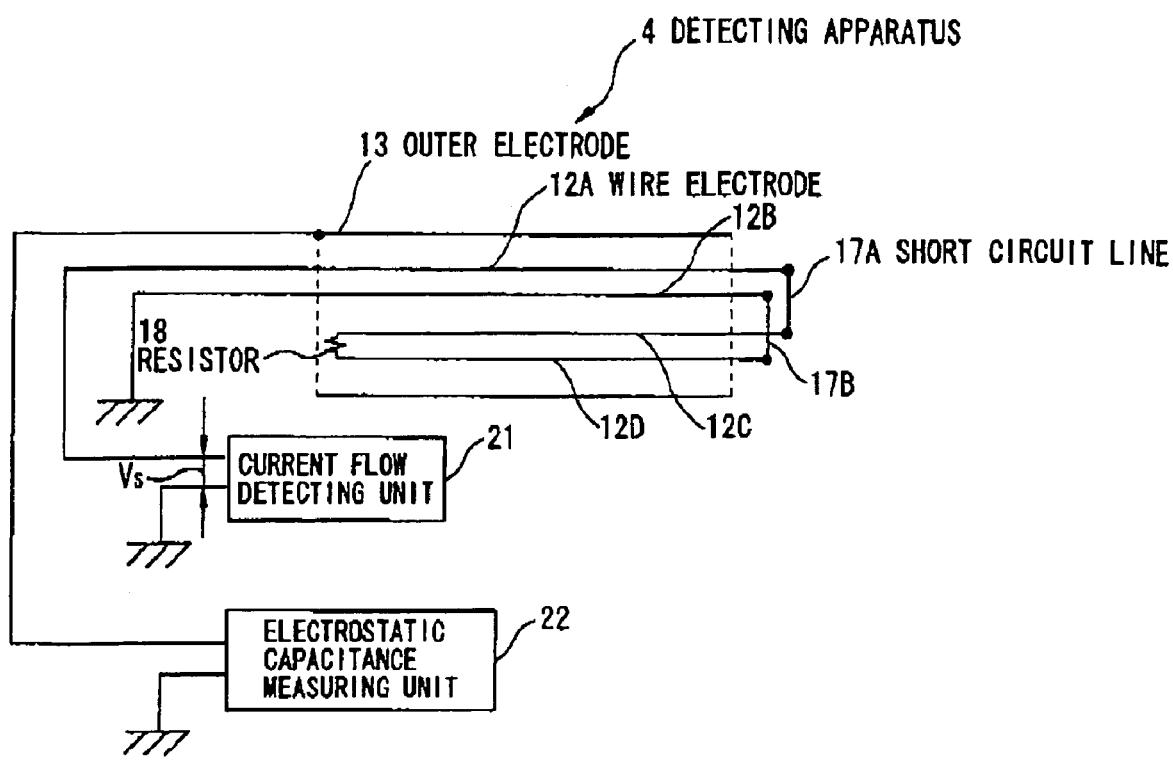
FIG. 8 is a schematic diagram showing a connection of a detecting apparatus using a variation of the cord switch.
Figure 9:
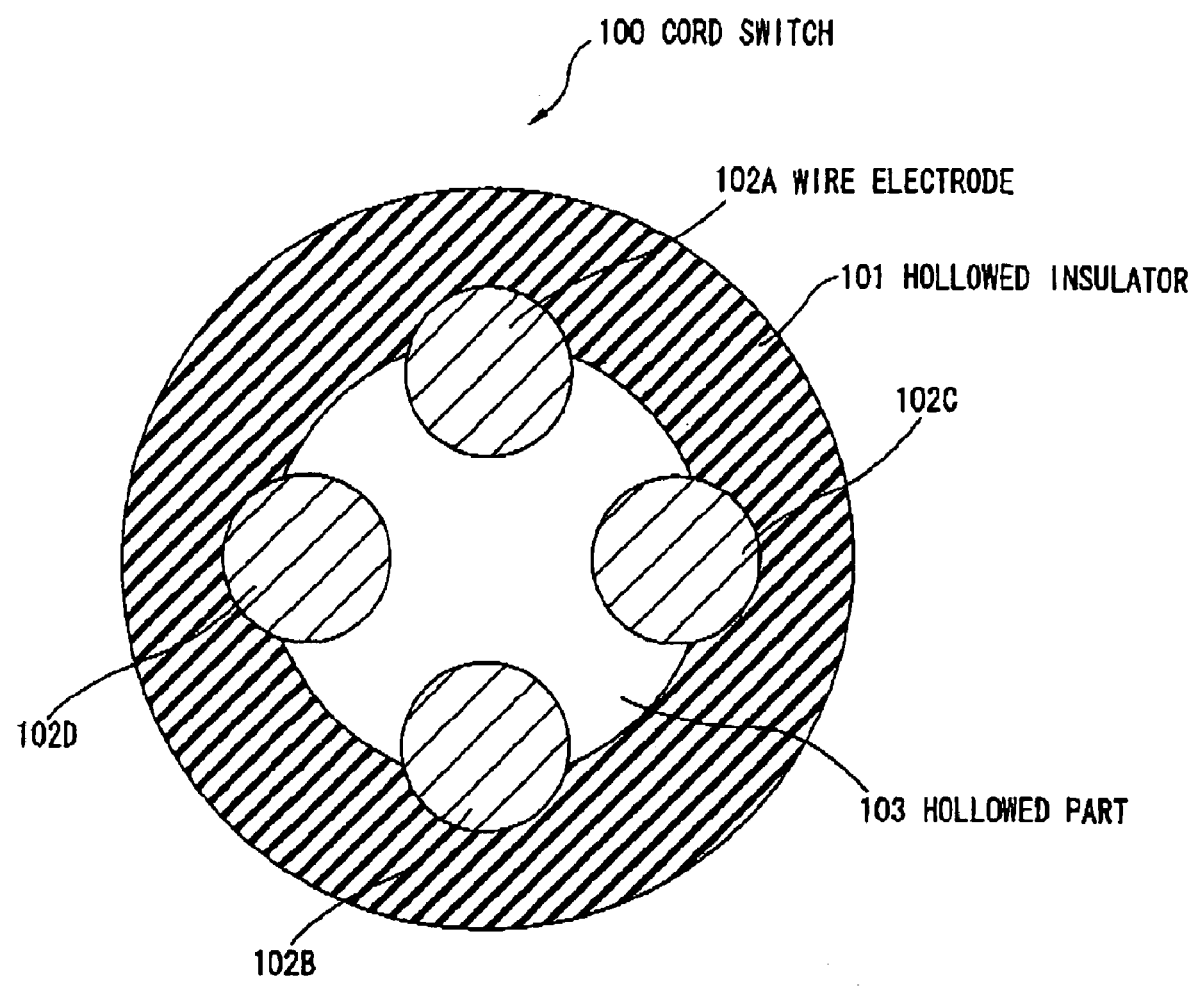
FIG. 9 is a cross-sectional view showing a structure of a conventional cord switch.
Figure 10:
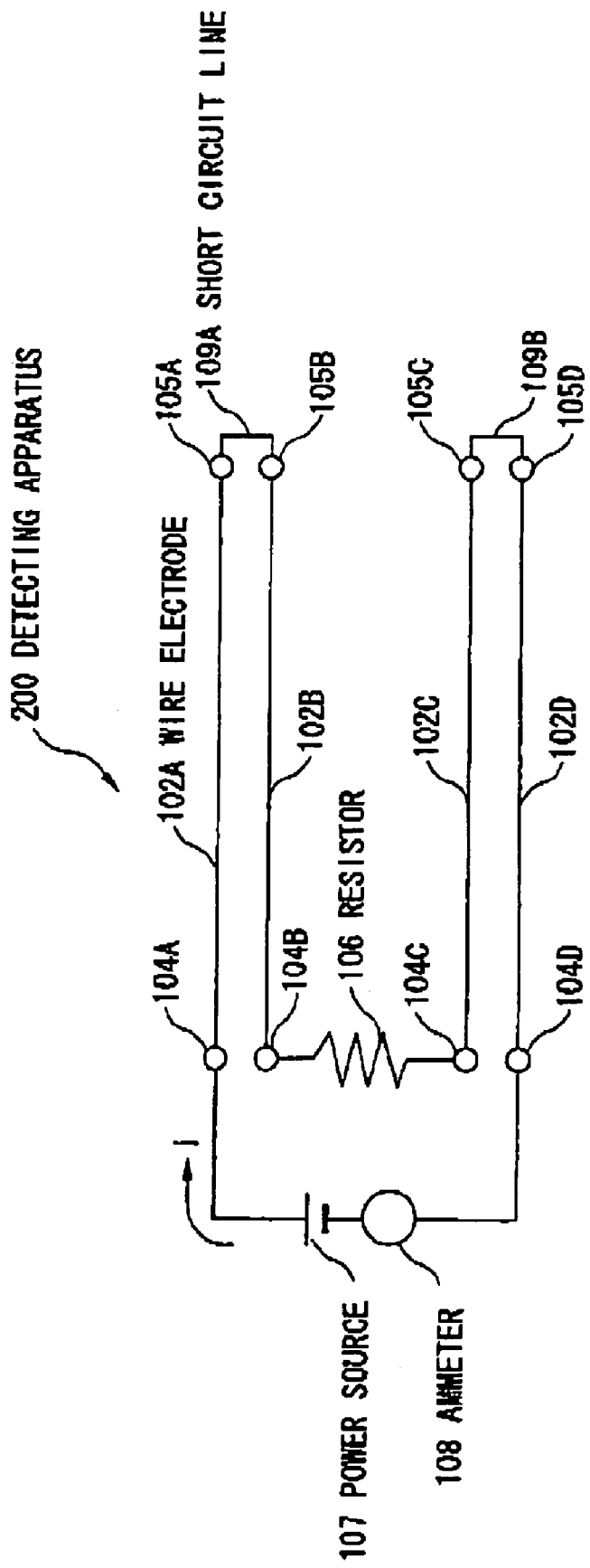
FIG. 10 is a schematic diagram showing a connection of a detecting apparatus using the cord switch of FIG. 8.

In addition, in the first to fourth preferred embodiments, the structures of the detecting apparatus in which a resistor is not connected to the wire electrode are described. However, it is possible to constitute the detecting apparatus in which a resistor is provided between the wire electrode 12B and 12C as shown in FIG. 8. According to this structure, a contact between the wire electrodes can be detected by an alteration in resistance value or an alteration in a current value.

Further, it is possible to provide a configuration in which an electric wire comprising a fine metal conductor coated with a thin insulating film is wound around an outer periphery of a cord switch as an outer electrode 13, thereby omitting an insulating layer 14.

Still further, in the first to fourth preferred embodiments, the case where the cord switch 1 is applied to the detection of sticking in the sliding door, back door, window or the like of the vehicle is explained. The present invention is not limited thereto, and the cord switch 1 can be used as a sensor for preventing the sticking in the automatic door or a sensor for preventing the intrusion.

In addition, in the first to fourth preferred embodiments, the door driving motor is rotated in a reverse direction in response to the detection signal generated when the electrostatic capacitance is varied from C to (C+ΔC), but the present invention is not limited thereto. The door driving motor may be decelerated or stopped. Further, an alert may be promoted by a sound or voice buzzer or the like.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A cord switch, comprising:
   a hollowed insulator having restorability,
   a plurality of wire electrodes arranged along an inner surface of a hollow part of the hollowed insulator in a longitudinal direction such that the wire electrodes do not electrically contact with each other when the hollowed insulator is in a restored state; and
   an outer electrode provided around an outer periphery surface of the hollowed insulator, the outer electrode forming an electrostatic capacitance between the outer electrode and one of the wire electrodes and forming a floating electrostatic capacitance between the outer electrode and the earth.

2. The cord switch, according to claim 1, wherein:
   the outer electrode comprises fine conductive wires wound around the outer periphery surface of the hollowed insulator.

3. The cord switch, according to claim 1, wherein:
   the outer electrode comprises fine conductive wires braided to cover the outer periphery surface of the hollowed insulator.

4. The cord switch, according to claim 1, wherein:
   the outer electrode comprises a strip-shaped conductive member wound around the outer periphery surface of the hollowed insulator.

5. The cord switch, according to claim 1, wherein:
   the outer electrode comprises a conductive member provided around the outer periphery surface of the hollowed insulator along the longitudinal direction, the conductive member having a strip-shape.

6. The cord switch, according to claim 1, wherein:
   the outer electrode is jacketed with an insulating layer.

7. The cord switch, according to claim 1, wherein:
   each of the wire electrodes comprises a metal strand wire coated with a conductive electrode member.

8. The cord switch, according to claim 7, wherein:
   the hollowed insulator comprises a restorative rubber and the conductive electrode members comprise a conductive rubber.

9. The cord switch, according to claim 7, wherein:
   the hollowed insulator comprises a restorative resin and the conductive electrode members comprise a conductive plastic.

10. The cord switch according to claim 1, wherein:
    the wire electrodes include a first wire electrode for being provided with a signal and a second wire electrode for grounding, and the electrostatic capacitance is formed between the second wire electrode and the outer electrode.

11. The cord switch according to claim 1, wherein:
    the outer electrode is configured to connect to a detecting unit for measuring the electrostatic capacitance and the floating electrostatic capacitance.

12. A detecting apparatus, comprising: a cord switch comprising:
    a hollowed insulator having restorability,
    a plurality of wire electrodes including a first wire electrode for being provided with a signal and a second wire electrode for grounding, the wire electrodes being arranged along an inner surface of a hollow part of the hollowed insulator in a longitudinal direction such that the wire electrodes do not electrically contact with each other when the hollowed insulator is in a restored state; and
    an outer electrode provided around an outer periphery surface of the hollowed insulator, the outer electrode forming an electrostatic capacitance between the outer electrode and the second wire electrode and forming a floating electrostatic capacitance between the outer electrode and the earth;

a first detecting unit for detecting an alteration in an electric potential or an alteration in a current flow between the first wire electrode and the second wire electrode; and a second detecting unit, connected to the outer electrode, for detecting an alteration in the electrostatic capacitance and an alteration in the floating electrostatic capacitance by measuring the electrostatic capacitance and the floating electrostatic capacitance.

13. The detecting apparatus, according to claim 12, wherein:

the number of the wire electrodes is 2n, n being a positive integer.

14. The detecting apparatus, according to claim 13, wherein:

the cord switch comprises four wire electrodes, and each two of the wire electrodes are connected in series.

15. The detecting apparatus, according to claim 13, wherein:

the cord switch comprises four wire electrodes, and each two of the wire electrodes are connected in parallel.

16. The detecting apparatus, according to claim 12, further comprising:

a third wire electrode connected in series between the first wire electrode for signal and the second wire electrode;

a resistor connected between the first wire electrode and the second wire electrode via the third wire electrode.

17. The detecting apparatus according to claim 12, wherein:

the electrostatic capacitance formed between the second wire electrode and the outer electrode is measured for detecting the alteration in the electrostatic capacitance.

* * * * *